United States Patent
Kwak (10) Patent No.: US 7,082,258 B2
(45) Date of Patent: Jul. 25, 2006

(54) INTERLEAVING METHOD FOR SHORT BURST ERROR CORRECTION IN HIGH DENSITY DIGITAL VERSATILE DISK

(75) Inventor: Dae Yon Kwak, Kunpo-Si (KR)

(73) Assignee: Daewoo Electronics Corporation, Seoul (KR)

( * ) Notice: Subject to any disclaimer, the term of this patent is extended or adjusted under 35 U.S.C. 154(b) by 1137 days.

(21) Appl. No.: 09/922,861

(22) Filed: Aug. 7, 2001

(65) Prior Publication Data
US 2002/0044767 A1 Apr. 18, 2002

(30) Foreign Application Priority Data
Aug. 23, 2000 (KR) ................ 2000-48929

(51) Int. Cl.
*H04N 5/85* (2006.01)
(52) U.S. Cl. ................ 386/114; 386/125
(58) Field of Classification Search .......... 386/113, 386/114, 1, 116, 21, 47, 76, 125, 109
See application file for complete search history.

(56) References Cited

U.S. PATENT DOCUMENTS
6,122,764 A * 9/2000 Kobayashi ........... 714/758

* cited by examiner

Primary Examiner—Robert Chevalier
Assistant Examiner—Helen Shibru
(74) Attorney, Agent, or Firm—Jacobson Holman PLLC (57) ABSTRACT

Provided is a method for formatting and interleaving error correction blocks adaptively for improving a capability of correcting short burst errors in a high density DVD. The interleaving method includes the steps of merging a plurality of error code correction (ECC) blocks, each having a predetermined size, in a horizontal direction, to form a merged ECC block, and storing the merged ECC block in a buffer in units of a predetermined number of rows and interleaving the ECC block in units of a predetermined number of bytes in accordance with a predetermined interleaving rule. Since ECC block data of every two lines is first buffered and then interleaved by every four bytes rather than one by one byte, the interleaving speed can be increased and the memory required for interleaving can be saved.

1 Claim, 9 Drawing Sheets

| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|
| 91 | 92 | 93 | 94 | 95 | 96 | 97 | 98 | 99 | 100 | 101 | 102 | 103 | 104 | 105 | 106 | 107 | 108 | 109 | 110 | 111 | 112 | 113 |

| 23 | 24 | 25 | 26 | 27 | 28 | 29 | 30 | 31 | 32 | 33 | 34 | 35 | 36 | 37 | 38 | 39 | 40 | 41 | 42 | 43 | 44 | 45 |
|---|---|---|---|---|---|---|---|---|---|---|---|---|---|---|---|---|---|---|---|---|---|---|
| 114 | 115 | 116 | 117 | 118 | 119 | 120 | 121 | 122 | 123 | 124 | 125 | 126 | 127 | 128 | 129 | 130 | 131 | 132 | 133 | 134 | 135 | 136 |

| 46 | 47 | 48 | 49 | 50 | 51 | 52 | 53 | 54 | 55 | 56 | 57 | 58 | 59 | 60 | 61 | 62 | 63 | 64 | 65 | 66 | 67 | 68 |
|---|---|---|---|---|---|---|---|---|---|---|---|---|---|---|---|---|---|---|---|---|---|---|
| 137 | 138 | 139 | 140 | 141 | 142 | 143 | 144 | 145 | 146 | 147 | 148 | 149 | 150 | 151 | 152 | 153 | 154 | 155 | 156 | 157 | 158 | 159 |

| 69 | 70 | 71 | 72 | 73 | 74 | 75 | 76 | 77 | 78 | 79 | 80 | 81 | 82 | 83 | 84 | 85 | 86 | 87 | 88 | 89 | 90 |
|---|---|---|---|---|---|---|---|---|---|---|---|---|---|---|---|---|---|---|---|---|---|
| 160 | 161 | 162 | 163 | 164 | 165 | 166 | 167 | 168 | 169 | 170 | 171 | 172 | 173 | 174 | 175 | 176 | 177 | 178 | 179 | 180 | 181 |

FIG. 6B

| 0 | 45 | 92 | 137 | 2 | 47 | 94 | 139 | 4 | 49 | 96 | 141 | 6 | 51 | 98 | 143 | 8 | 53 | 100 | 145 | 10 | 55 | 102 |
|---|----|----|-----|---|----|----|-----|---|----|----|-----|---|----|----|-----|---|----|-----|-----|----|----|-----|
| 181 | 91 | 46 | 1 | 138 | 93 | 48 | 3 | 140 | 95 | 50 | 5 | 142 | 97 | 52 | 7 | 144 | 99 | 54 | 9 | 146 | 101 | 56 |

| 147 | 12 | 57 | 104 | 149 | 14 | 59 | 106 | 151 | 16 | 61 | 108 | 153 | 18 | 63 | 110 | 155 | 20 | 65 | 112 | 157 | 22 | 67 |
|-----|----|----|-----|-----|----|----|-----|-----|----|----|-----|-----|----|----|-----|-----|----|----|-----|-----|----|-----|
| 11 | 148 | 103 | 58 | 13 | 150 | 105 | 60 | 15 | 152 | 107 | 62 | 17 | 154 | 109 | 64 | 19 | 156 | 111 | 66 | 21 | 158 | 113 |

| 114 | 159 | 24 | 69 | 116 | 161 | 26 | 71 | 118 | 163 | 28 | 73 | 120 | 165 | 30 | 75 | 122 | 167 | 32 | 77 | 124 | 169 | 34 |
|-----|-----|----|----|-----|-----|----|----|-----|-----|----|----|-----|-----|----|----|-----|-----|----|----|-----|-----|-----|
| 68 | 23 | 160 | 115 | 70 | 25 | 162 | 117 | 72 | 27 | 164 | 119 | 74 | 29 | 166 | 121 | 76 | 31 | 168 | 123 | 78 | 33 | 170 |

| 79 | 126 | 171 | 36 | 81 | 128 | 173 | 38 | 83 | 130 | 175 | 40 | 85 | 132 | 177 | 42 | 87 | 134 | 179 | 44 | 89 | 136 | |
|----|-----|-----|----|----|-----|-----|----|----|-----|-----|----|----|-----|-----|----|----|-----|-----|----|----|-----|---|
| 125 | 80 | 35 | 172 | 127 | 82 | 37 | 174 | 129 | 84 | 39 | 176 | 131 | 86 | 41 | 178 | 133 | 88 | 43 | 180 | 135 | 90 | |

FIG. 7

| 182 | 182 | |
|---|---|---|
| RECORDING FRAME 0 | RECORDING FRAME 1 | ↕ 13 ROWS |
| RECORDING FRAME 2 | RECORDING FRAME 3 | |
| RECORDING FRAME 4 | RECORDING FRAME 5 | |
| ⋮ | ⋮ | |
| RECORDING FRAME 28 | RECORDING FRAME 29 | |
| RECORDING FRAME 30 | RECORDING FRAME 31 | |

FIG. 8

INTERLEAVING METHOD FOR SHORT BURST ERROR CORRECTION IN HIGH DENSITY DIGITAL VERSATILE DISK

BACKGROUND OF THE INVENTION

1. Field of the Invention

The present invention relates to a digital versatile disk (DVD) technology, and more particularly, to a method for formatting and interleaving error correction blocks adaptively for improving a capability of correcting short burst errors in a high density DVD.

2. Description of the Related Art

In general, DVDs are largely categorized as two types; read only DVDs and read and rewritable DVDs. The information storage on a read only type optical disk is realized by forming grooves called pits on the surface of the disk, "0" is assigned to represent a pit portion, and "1" is assigned to represent a non-pit portion (that is, a land). During reproduction, a laser is irradiated onto tracks of the disk, and "0" and "1" are distinguished according to a difference in the light reflectivity. For example, in a rewritable-and-erasable phase-transition optical disk, a recording layer of the disk undergoes structural transformation between crystalline and amorphous states by the heat generated from the laser. There are significant differences between the reflectivity of these two states, which correspond to "1" and "0", respectively. The recording layer can be selectively changed into either a crystalline state or an amorphous state by adjusting the power of a laser during recording.

Figure 2:
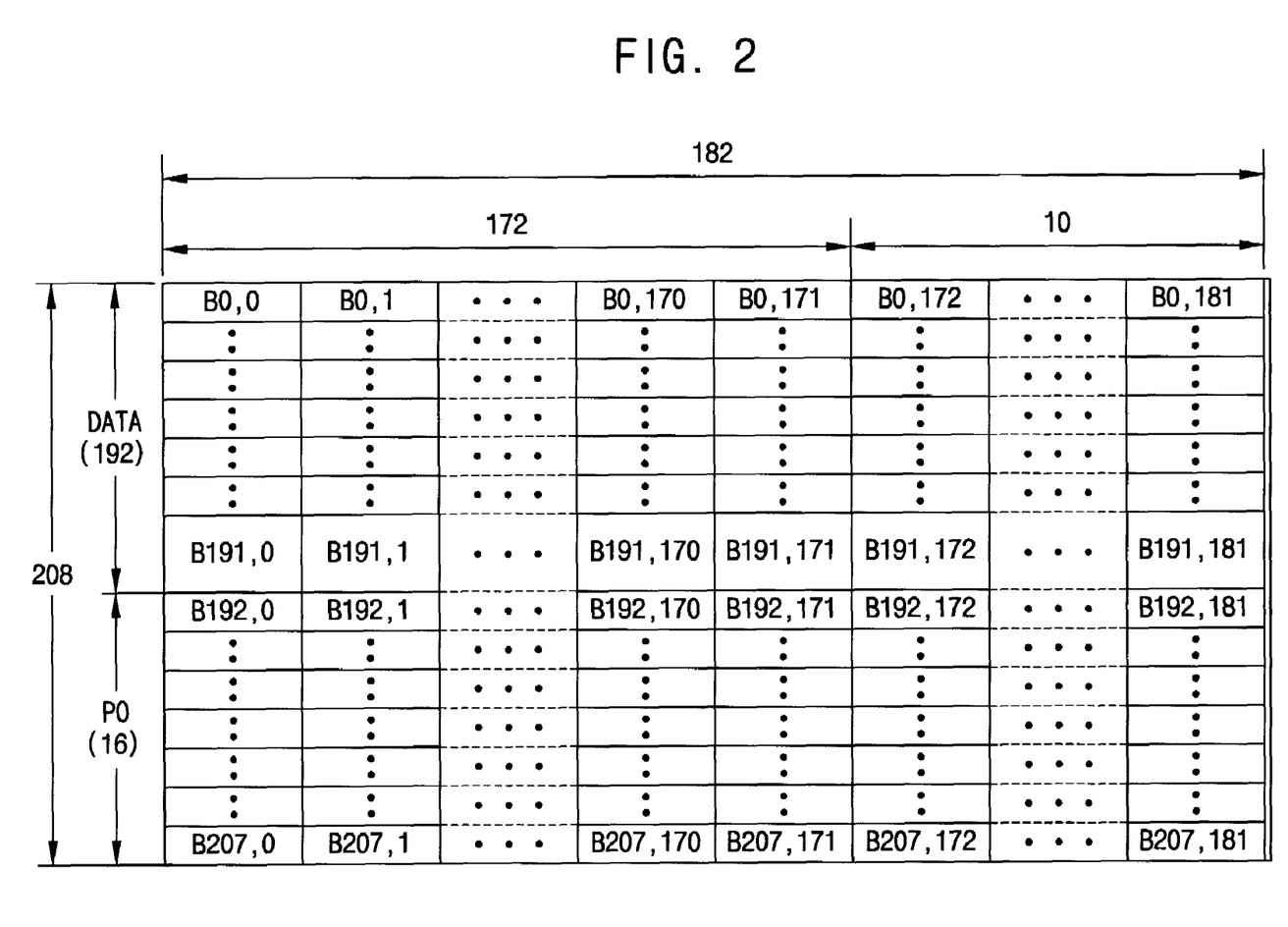
FIG. 2 shows a conventional error correction code (ECC) block in a DVD.

Errors generated at a DVD disk include random errors occurring to all channels, short burst errors due to dust or foreign matter, long burst errors due to scratches, or the like. To correct such errors, a conventional DVD error correction system employs a Reed-Solomon Product code. For example, in a digital versatile disk recorder (DVDR) having a storage capacity of 4.7 GB, in order to reduce correlation between adjacent data of data blocks, scrambling is performed on data blocks, and 16 sectors constituting each data block are grouped into a size of 12×172 bytes to form a data block of 192×172 bytes, as shown in FIG. 2. Then, RS (208, 192, 17) encoding is performed in a column direction to generate an outer code parity of 16 bytes (PO), and RS (182, 172, 11) encoding is performed in a row direction to generate an inner code parity of 10 bytes (PI), thereby forming a 208×182 byte ECC block.

Figure 3:
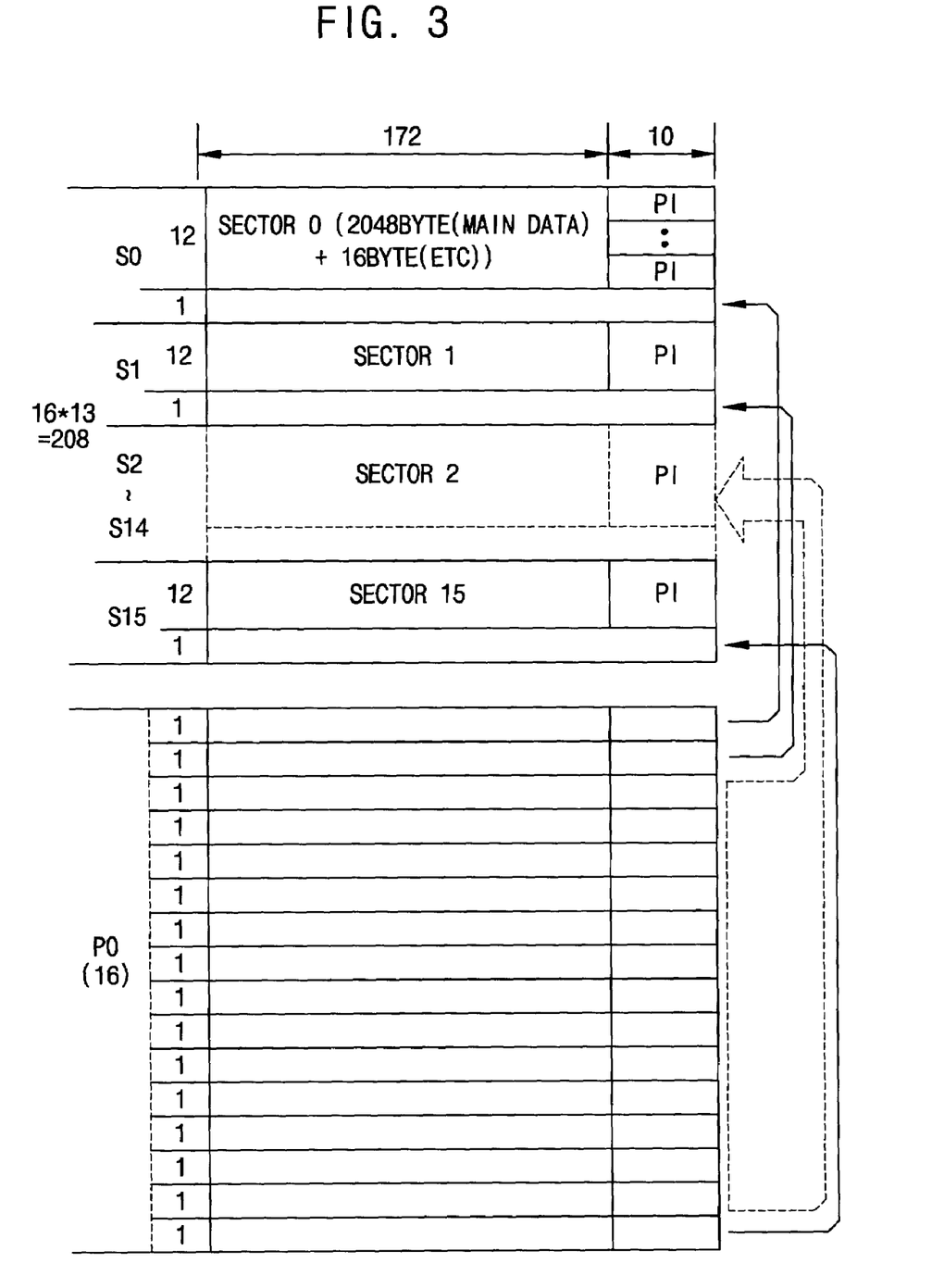
FIG. 3 shows the concept of conventional row interleaving in a DVD.

After obtaining the ECC block in such a manner, row interleaving is performed such that each PO portion is interleaved for every 12 rows, that is, at the end of the last row of each sector, as shown in FIG. 3. According to the conventional interleaving method, data can be transmitted in a uniform transmission rate, but error correction is completely dependent upon ECC cores, that is, an RS codec (PI and PO).

In order to attain a high density DVD, a laser spot of a DVD must be reduced to approximately a half that of a conventional DVD and a numerical aperture (NA) of a lens must be increased to make a transparent film of a laser incident plane thinner. Thus, foreign matter causing short burst errors, such as dust, or a scratch causing long burst errors, is relatively increased, thereby disabling from carrying out error correction processing using a conventional error correction system.

SUMMARY OF THE INVENTION

To solve the above-described problems, it is an object of the present invention to provide an interleaving method, which can improve an error correction capability in a high density DVD.

To accomplish the above object, there is provided an interleaving method for correcting short burst errors in a high density digital versatile disk (DVD), the method comprising the steps of merging a plurality of error correction code (ECC) blocks, each having a predetermined size, in a horizontal direction, to form a merged ECC block, and storing the merged ECC block in a buffer in units of a predetermined number of rows and interleaving the ECC block in units of a predetermined number of bytes in accordance with a predetermined interleaving rule.

Figure 6A:
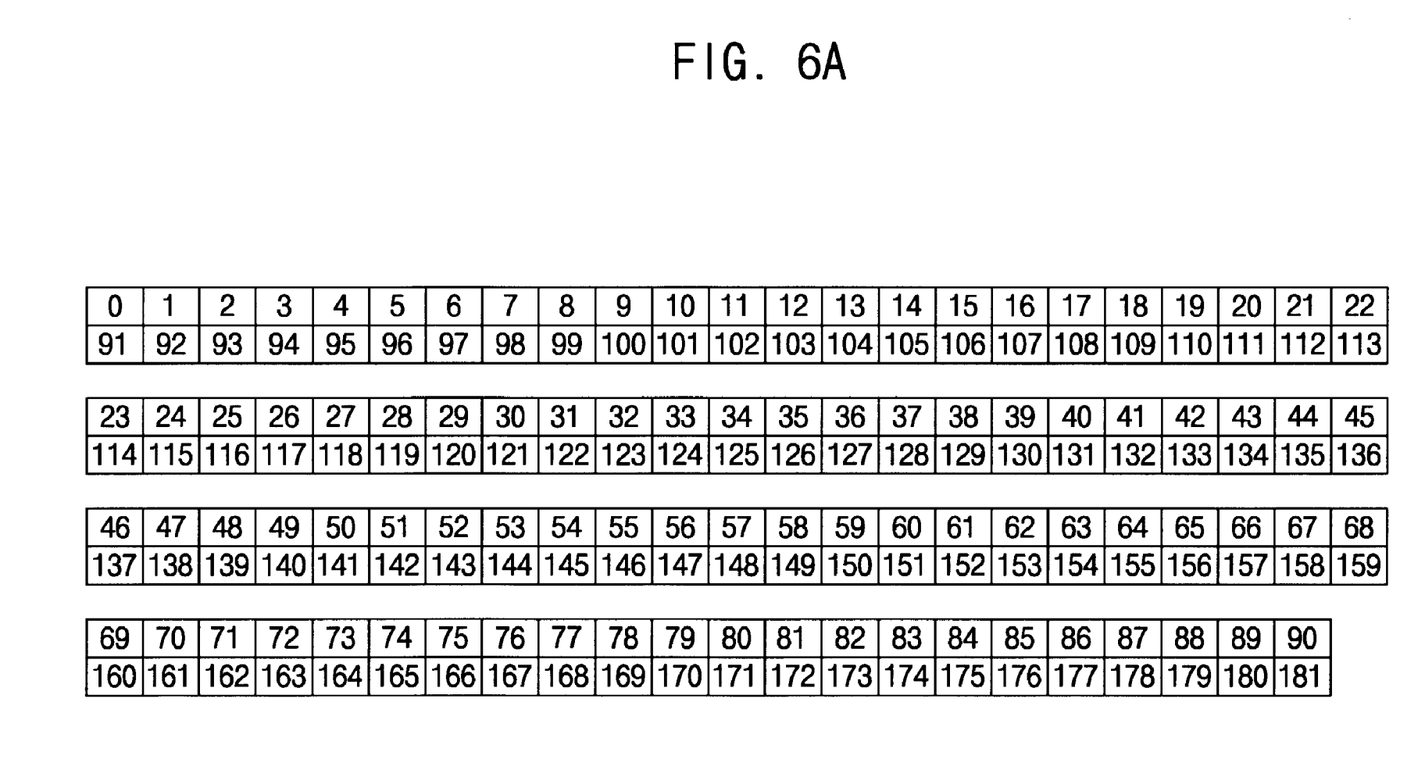
FIG. 6A shows the sequence of data before interleaving for every 2 lines, when the interleaving is performed on the ECC block shown in FIG. 5 according to the present invention.
Figure 6B:
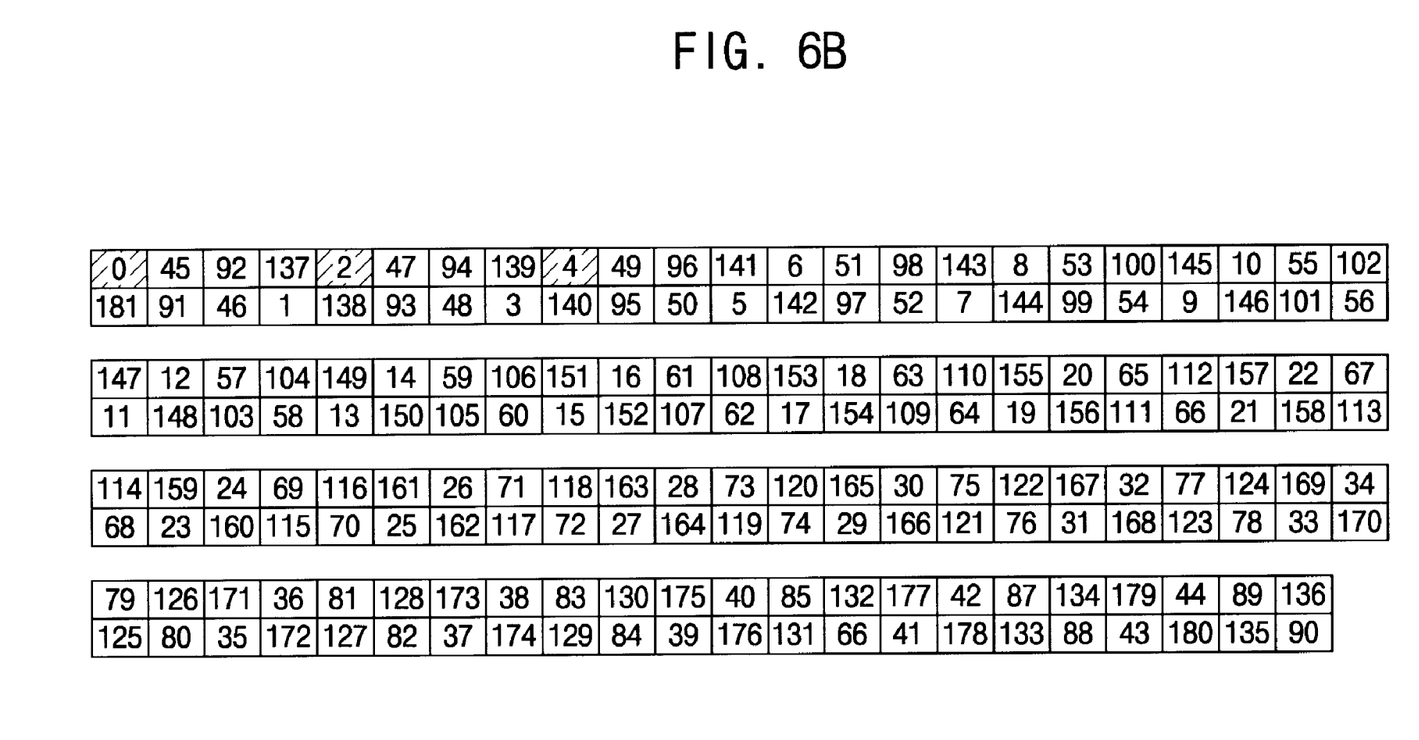
FIG. 6B shows the sequence of data after interleaving the data shown in FIG. 6A according to the present invention.

Based on the interleaving rule according to the present invention, 2 ECC blocks are linked together in a row direction to generate a new ECC block, which is then interleaved in units of 2 lines. FIG. 6A shows data arrangement before interleaving, and FIG. 6B shows data arrangement after interleaving.

BRIEF DESCRIPTION OF THE DRAWINGS

The above objects and advantages of the present invention will become more apparent by describing preferred embodiments in detail thereof with reference to the attached drawings in which.

DETAILED DESCRIPTION OF THE INVENTION

A preferred embodiment of the present invention will now be described in detail with reference to the accompanying drawings.

Figure 1:
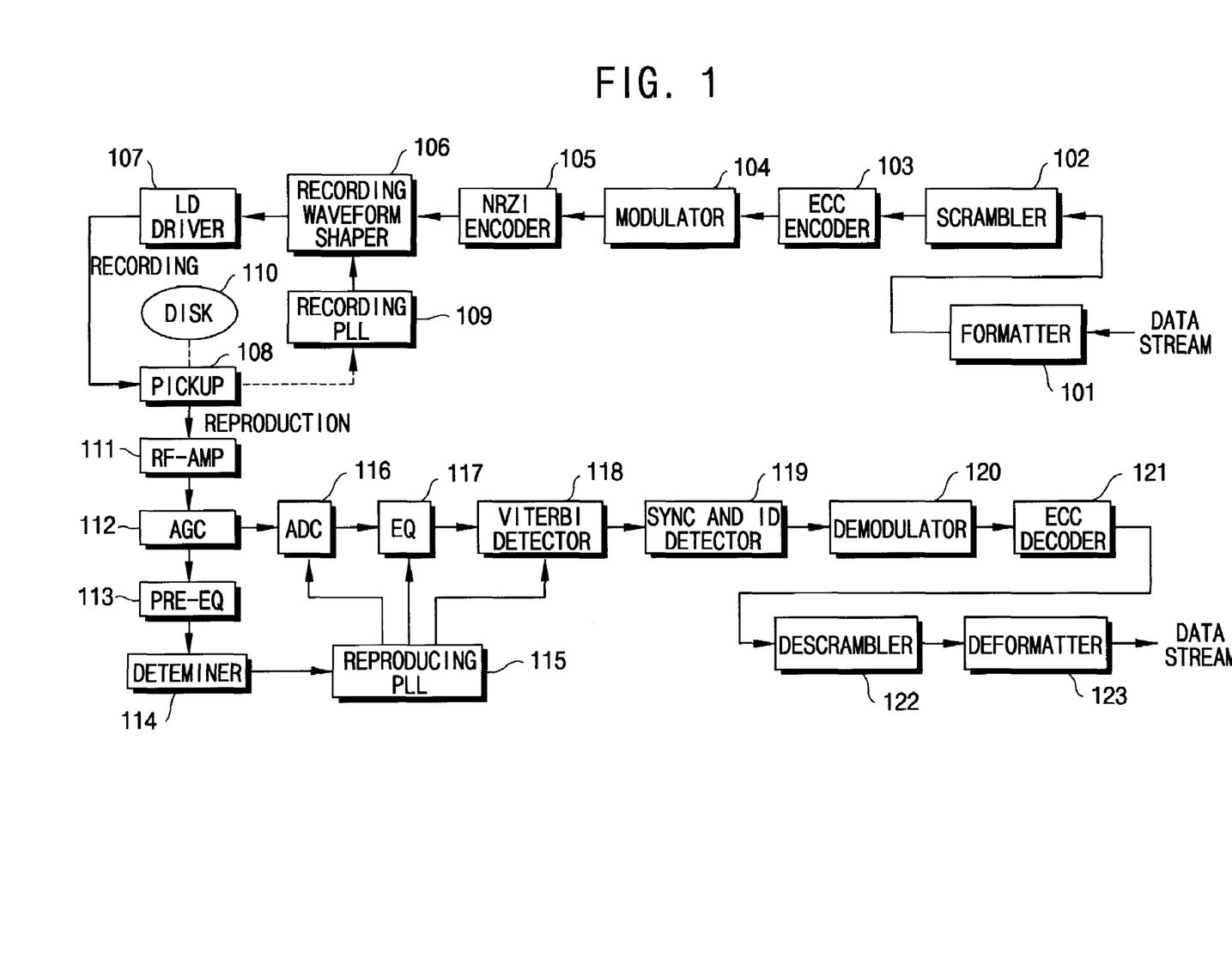
FIG. 1 is a schematic diagram of a general digital versatile disk (DVD) adaptable to the present invention.

FIG. 1 is a schematic diagram of a general digital versatile disk-random access memory (DVD-RAM) adaptable to the present invention. Referring to FIG. 1, the DVD-RAM includes a recording portion in which recording on a disk 110 is performed using a pickup 108, and a reproduction portion in which reproduction from the disk 110 using the pickup 108. The recording portion includes a formatter 101, a scrambler 102, an ECC encoder 103, a modulator 104, a non-return-to-zero inverse (NRZI) encoder 105, a recording waveform shaper 106, a laser driver (LD driver) 107, and a recording phase locked loop (PLL) 109. The reproduction portion includes a radio frequency amplifier (RF-AMP) 111, an automatic gain control circuit (AGC) 112, a pre-equalizer (PRE-EQ) 113, a determiner 114, a reproducing PLL 115, an analog-to-digital converter (ADC) 116, an equalizer (EQ) 117, a Viterbi detector 118, a sync and ID code detector 119, a demodulator 120, an ECC decoder 121, a descrambler 122 and a deformatter 123.

The formatter 101 receives data streams from an MPEG-2 encoder or a data source to form data having a predetermined format. The ECC encoder 103 performs error correction encoding using Reed-Solomon Product Codes (RS-PC). In the present invention, the ECC encoder 103, as will be described later, improves an error correction capability by interleaving ECC blocks in units of 4 bytes after forming a new ECC block produced by combining two conventional ECC blocks in a horizontal direction. The modulator 104 performs run-length limited (RLL) encoding to eliminate an unwanted direct current (DC) component. The NRZI encoder 105 encodes the output of the modulator 104 into an NRZI code. The NRZI coded signal is shaped of a recording waveform by the recording waveform shaper 106 to then drive the LD driver 107 to be recorded on the disk 110 by the pickup 108. The laser power during recording is greater than that during reproduction, thereby allowing a phase transition of the disk 110. The recording PLL 109 supplies clock pulses for recording, using wobble pit signals recorded on the disk 110.

The signals recorded on the disk 110 are read by the pickup 108, amplified by the RF-AMP 111, gain-controlled by the AGC 112, converted into digital signals by the ADC 116 and then applied to the EQ 117. Here, the output of the AGC 112 is reproduced as clocks by the PRE-AMP 113, the determiner 114 and the reproducing PLL 115, and then data is reproduced by the Viterbi detector 118. The sync and ID code detector 119 detects the sync of a data frame. The demodulator 120 demodulates the reproduced signal. The operation of the demodulator 120 is performed in the reverse direction to that of the modulator 104. The output of the demodulator 120 is error-corrected by the ECC decoder 121 to then be output as data streams via the descrambler 122 and the deformatter 123. The operation of the respective parts of the reproducing unit is performed in the reverse direction to that of the recording unit.

Figure 4:
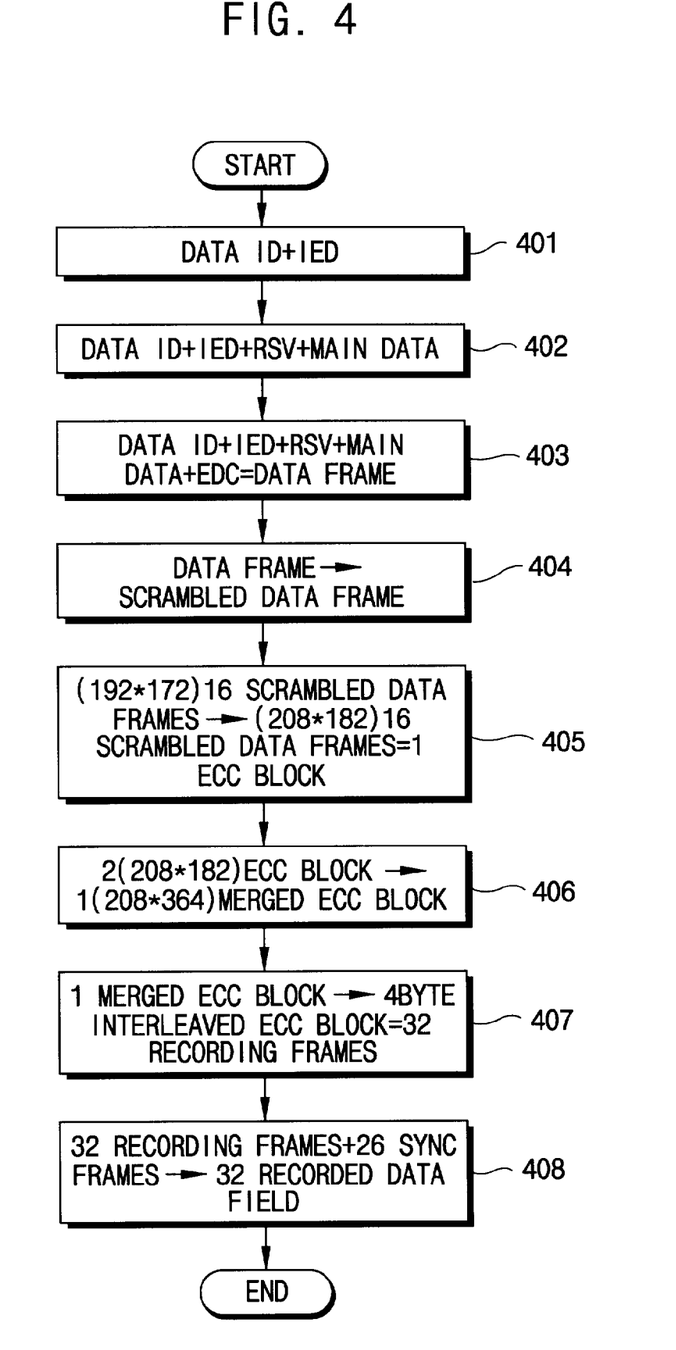
FIG. 4 is a flow chart showing a method for processing data frames of a high density DVD according to the present invention.

FIG. 4 is a flow chart showing a method for processing data frames of a high density DVD according to the present invention. Referring to FIG. 4, in step 401, an ID error detection code (IED) is added to data ID of 4 bytes. In step 402, a 6-byte reserve code (RSV) and 2048-byte main data are added to the format constructed in step 401. In step 403, a 4-byte error detection code (EDC) is added to the format constructed in step 402 to complete a data frame. In step 404, the data frame is scrambled. The steps 401 through 403 are performed by the formatter 101 shown in FIG. 1, and the step 404 is performed by the scrambler 102.

Then, in step 405, encoding using RS-PC is performed on the 16 scrambled data frames, and 16 PO portions and 10 PI portions are added, thereby forming one 208×182 byte ECC block. In step 406, two ECC blocks are merged to form a merged ECC block of 208×364 bytes. In step 407, 4-byte interleaving according to the present invention is performed with respect to the merged ECC block (208×364) in units of 2 lines.

Figure 8:
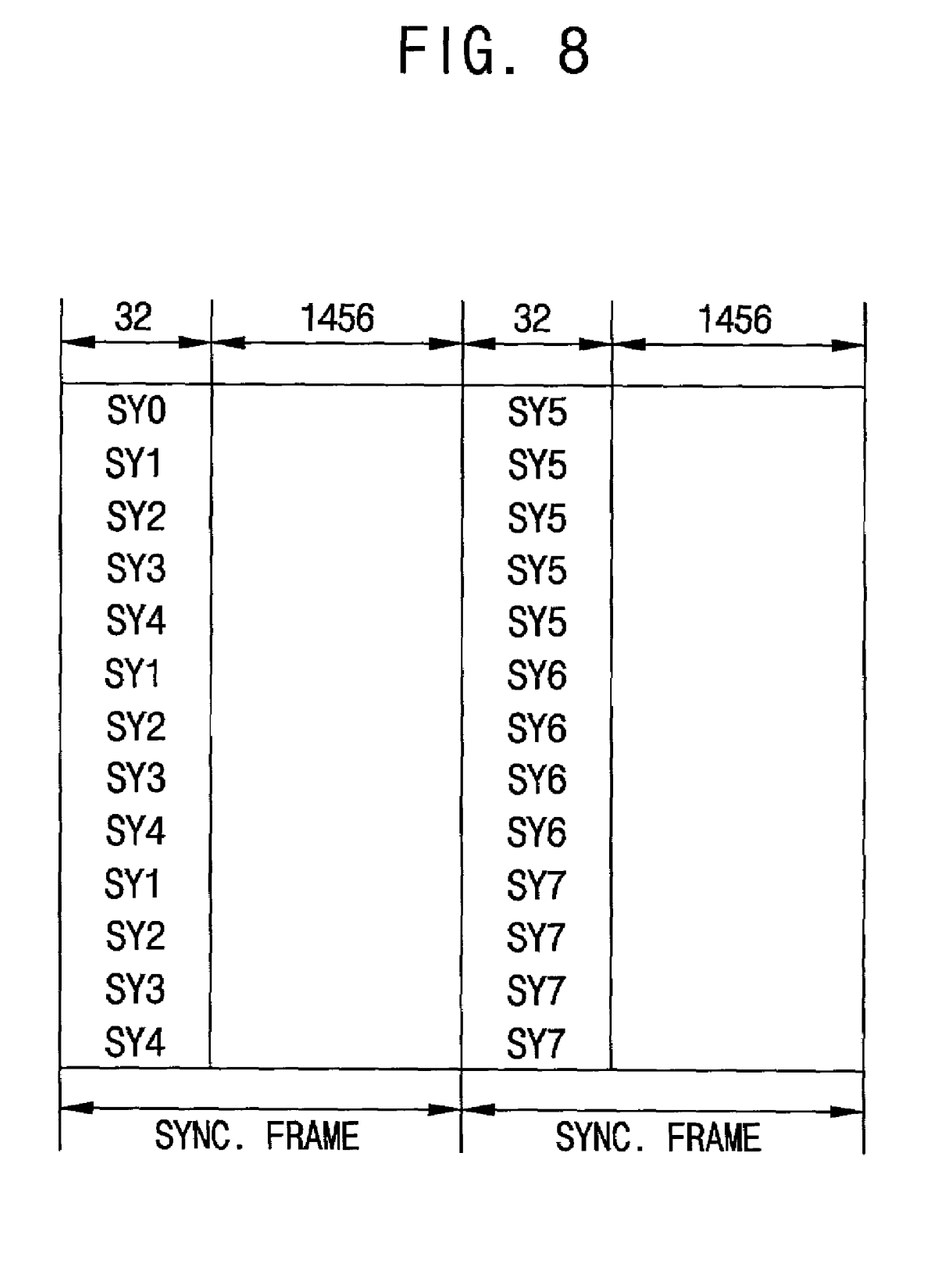
FIG. 8 shows a structure of a data field recorded on a high density DVD.

After interleaving, the interleaved ECC block (208×364) is formed as 32 recording frames each having a size of merged ECC block of 13×182. The format of data recorded on the disk is composed of frames each having sync codes corresponding to the respective states, as shown in FIG. 8.

Figure 5:
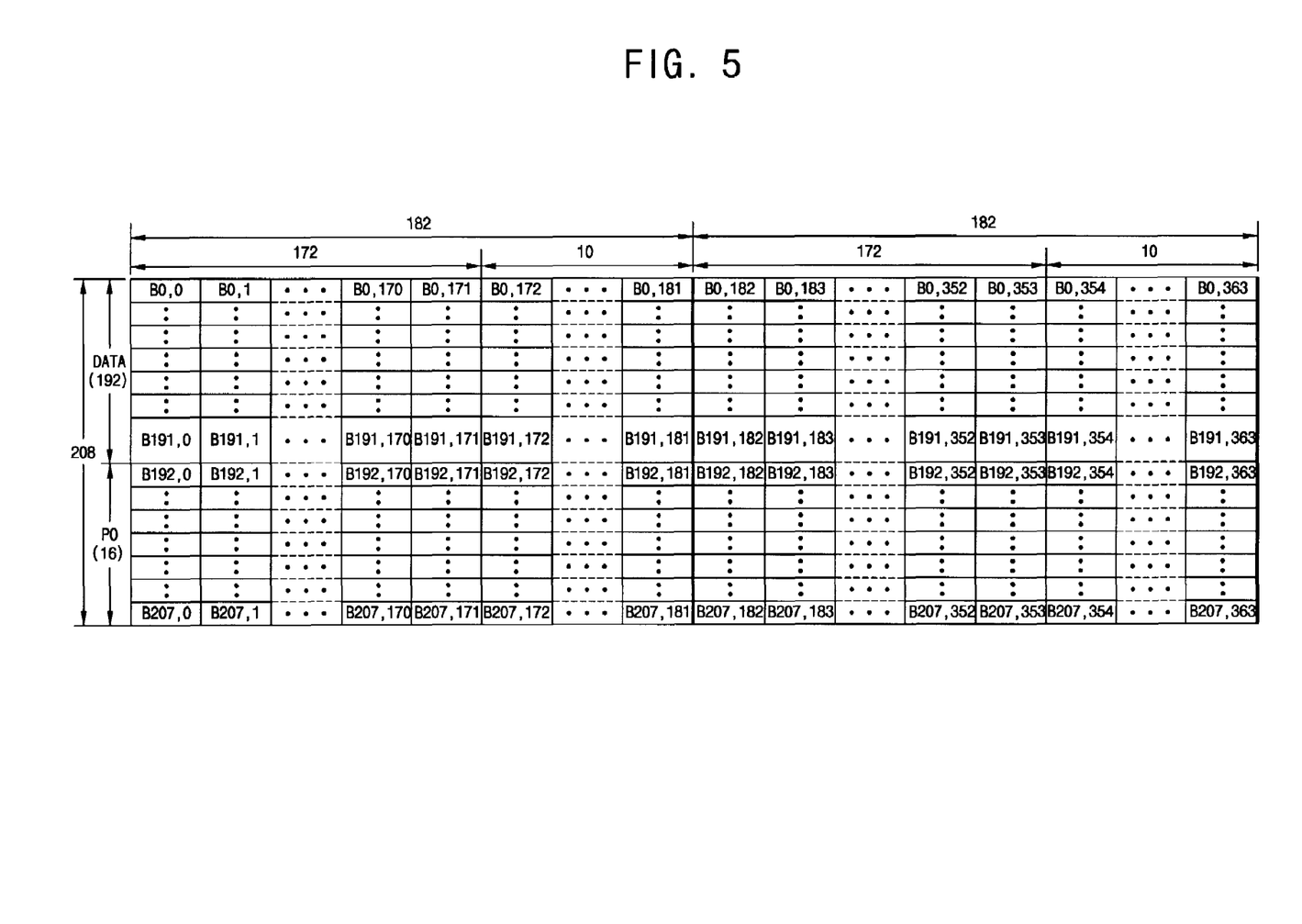
FIG. 5 shows an ECC block in a high density DVD according to the present invention.

FIG. 5 shows an ECC block in a high density DVD according to the present invention. The ECC block according to the present invention is produced by merging two conventional ECC blocks in a horizontal direction to have a size of 208×364 bytes. Referring to FIG. 5, Reed-Solomon encoding is performed with respect to a 192×172 data matrix composed of data ranging from B0,0 through B0,171 of the first row to B191,0 through B191,171 of the 192nd row, in column and row directions, PO and PI are interleaved to obtain a 208×172 ECC block, and another ECC block obtained in the same method as the 208×172 ECC block, is merged in a horizontal direction, thereby forming a new ECC block ranging from B0,0 through B0,363 to B207,0 through B207,363.

With respect to the thus-formed ECC block, as shown in FIG. 6A, data of two rows (2×364) ranging from B0,0 through B0,363 to B1,0 through B1,363, are stored in a buffer, every 4 bytes are grouped and then indices of 0 through 181 are sequentially assigned thereto. Then, as shown in FIG. 6B, the corresponding data are interleaved in units of indices for re-arrangement. In other words, letting m be the index assigned before interleaving and k be the index assigned after interleaving, the following formulae 1 and 2 are satisfied.

Formula 1

1) when t=0, k=2m, where m=2t
2) when t=1, 2, . . . , 22, k=2m, where m=2t
k=2(m−1)+94, where m=2t−1
3) when t=23, 24, . . . , 45, k=2(m−45)+1, where m=2t−1
k=2(m−46)+93, where m=2t Formula 2

4) when t=46, 47, . . . , 68, k=2(m−92)+2, where m=2t
k=2(m−91)+92, where m=2t−1
5) when t=69, 70, . . . , 90, k=2(m−137)+3, where m=2t−1
k=2(m−138)+95, where m=2t
6) when t=91, k=2(m−137)+3, where m=2t−1.

wherein reference symbol 't' used in each three equations of the above formulae 1 and 2, denotes a positive integer of greater than or equal to 91 inclusive of 0.

Referring to FIGS. 6A and 6B, a cell assigned with indices 0, 1, . . . , 181 is data of 4 bytes. In the ECC block as described in FIG. 5, two lines are interleaved in the following order. As shown in FIG. 6A, indices 0 through 90 are sequentially assigned to the first line and indices 91 through 181 are then sequentially assigned to the second line, which leads to findings that the indices originally assigned to data are mixed due to re-arrangement by the interleaving according to the present invention, as shown in FIG. 6B.

When the data sequence shown in FIG. 6B, that is, the data re-arranged after interleaving, with the data sequence shown in FIG. 6A, the initial indices of the first four cells of the first line, 0, 45, 92 and 137, are incremented by two, respectively. That is to say, the initial indices 0, 45, 92 and 137 become 2, 47, 95 and 139, then become 4, 49, 96 and 141, . . . and finally become 44, 89, 136 and 181. Here, the index value 181 corresponds to the first cell of the second line. Then, the initial indices for the first four cells of the second line, are assigned with 91, 46, 1 and 138 and then incremented by two, respectively. That is, the initial values

91, 46, 1 and 138 are followed by 93, 48, 3 and 140, then by 95, 50, 5 and 142, and finally by 43, 180, 135 and 90.

After the first two rows are interleaved, the rows are inserted again into the original ECC block, and then data of B2,0 through B3,363 of two subsequent rows are interleaved in the same manner as described above. The overall interleaving procedure is repeatedly performed 104 times, thereby completing a Byte Merged Inter-Row Interleaving operation.

Figure 7:
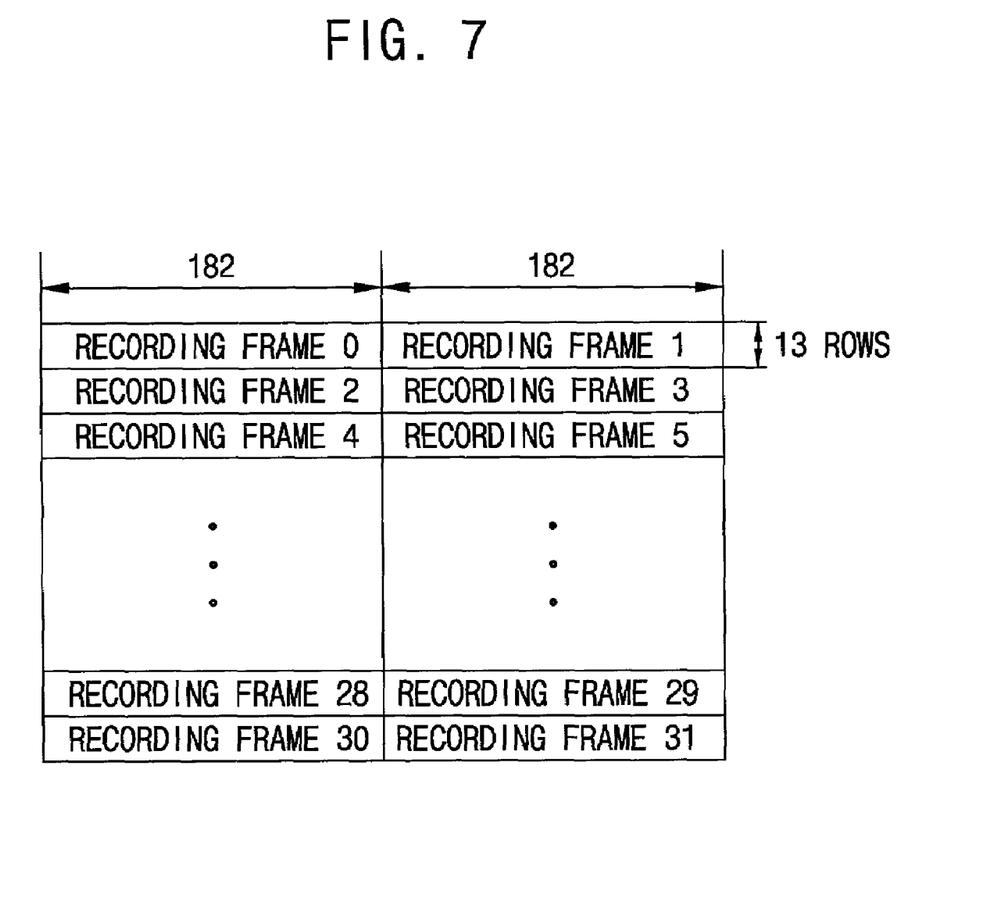
FIG. 7 shows an exemplary formatting of recording frames in a high density DVD.

FIG. 7 shows an exemplary formatting of recording frames in a high density DVD. After interleaving, an interleaved ECC block (208×364) is divided into 32 recording frames each having a size of 13×182. Then, 26 sync frames are added to the 32 recording frames, so that they are recorded as the format after modulation, as shown in FIG. 8.

As described above, according to the present invention, the error correction capability of a high density DVD can be improved by distributing short burst errors horizontally and vertically. Also, according to the present invention, interleaving is performed in part rather than in entirety of an ECC block, thereby reducing the size of a buffer memory for interleaving. Further, since 4-byte interleaving, rather than 1-byte interleaving, is employed, the number of memory addressing operations for interleaving can be reduced. Also, adopting a plurality of buffers for interleaving can advantageously increase the interleaving speed.

What is claimed is:

1. An interleaving method for correcting short burst errors in a digital versatile disk (DVD), the method comprising the steps of:

merging a plurality of error correction code (ECC) blocks, each having a predetermined size, in a horizontal direction, to form a merged ECC block; and storing the merged ECC block in a buffer in units of a predetermined number of rows and interleaving the ECC block in units of a predetermined number of bytes in accordance with a predetermined interleaving rule, wherein when interleaving is performed such that every two ECC blocks are merged in a horizontal direction to form a new ECC block and the merged ECC blocks are grouped in units of two lines for interleaving, the predetermined interleaving rule satisfies the following formulae:

1) when t=0, k=2m, where m=2t
2) when t=1, 2, . . . , 22, k=2m, where m=2t
   k=2(m−1)+94, where m=2t−1
3) when t=23, 24, . . . , 45, k=2(m−45)+1, where m=2t−1
   k=2(m−46)+93, where m=2t
4) when t=46, 47, . . . , 68, k=2(m−92)+2, where m=2t
   k=2(m−91)+92, where m=2t-1
5) when t=69, 70, . . . , 90, k=2(m−137)+3, where m=2t−1
   k=2(m−138)+95, where m=2t
6) when t=91, k=2(m−137)+3, where m=2t−1.

wherein reference symbol 't' used in six equations of the above formulae, denotes a positive integer of greater than or equal to 91 inclusive of 0, m is let to be the index assigned before interleaving and k is let to be the index assigned after interleaving.

* * * * *